US011324110B2

(12) United States Patent
Sarma A et al.

(10) Patent No.: US 11,324,110 B2
(45) Date of Patent: May 3, 2022

(54) STANDOFF FOR CIRCUIT BOARD HAVING TEMPERATURE-VARIABLE ELECTRICAL ELEMENT

(71) Applicant: HONEYWELL INTERNATIONAL INC., Morris Plains, NJ (US)

(72) Inventors: NSV Sarveswara Sarma A, Bangalore (IN); Saravanakumar Mahalingam, Bangalore (IN); Rama Kumar Mayil, Bangalore (IN); Ravi Anekal Radhakrishnan, Bangalore (IN)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 129 days.

(21) Appl. No.: 16/860,965

(22) Filed: Apr. 28, 2020

(65) Prior Publication Data

US 2021/0282259 A1    Sep. 9, 2021

(30) Foreign Application Priority Data

Mar. 3, 2020    (IN) .............................. 202011009058

(51) Int. Cl.
*H05K 1/02*    (2006.01)
*H05K 7/14*    (2006.01)

(52) U.S. Cl.
CPC ......... *H05K 1/0209* (2013.01); *H05K 1/0212* (2013.01); *H05K 7/142* (2013.01);
(Continued)

(58) Field of Classification Search
CPC ............. H05K 7/20454; H05K 7/2049; H05K 7/1427; H05K 7/142; H05K 1/0212;
(Continued)

(56) References Cited

U.S. PATENT DOCUMENTS 5,345,366 A * 9/1994 Cheng .................... H01R 12/52
174/138 G
6,587,351 B2    7/2003 Hollinsworth et al.
(Continued)

FOREIGN PATENT DOCUMENTS

DE    102011075901 A1 * 11/2012 ......... G07C 9/00944

OTHER PUBLICATIONS

English Translation of DE102011075901-A1 (Year: 2012).*

*Primary Examiner* — Zachary Pape
*Assistant Examiner* — Amir A Jalali
(74) *Attorney, Agent, or Firm* — Lorenz & Kopf, LLP

(57) ABSTRACT

A temperature-variable standoff includes a temperature-variable electrical element. The standoff also includes a support body that supports the temperature-variable electrical element and that is configured to support a circuit board separated at a distance from another component of an electronics assembly. The support body is configured to attach to the circuit board and to project away from the circuit board with a first end proximate the circuit board and a second end spaced away from the circuit board. The standoff further includes an electrical connector supported proximate the first end. The electrical connector is configured to electrically connect within an electrical circuit of the circuit board to provide the electrical input to the temperature-variable electrical element for selectively varying the temperature thereof.

20 Claims, 6 Drawing Sheets

(52) U.S. Cl.
CPC ........... *H05K 2201/066* (2013.01); *H05K 2201/10196* (2013.01); *H05K 2201/10219* (2013.01)

(58) Field of Classification Search
CPC ........... H05K 1/0203; H05K 1/181; H05K 2201/066; F28F 2255/02; F28F 2255/04; H01L 23/40
See application file for complete search history.

(56) References Cited

U.S. PATENT DOCUMENTS

| | | | |
|---|---|---|---|
| 6,631,078 B2 | 10/2003 | Alcoe et al. | |
| 8,049,731 B2 * | 11/2011 | Baker | G06F 3/0485 345/173 |
| 9,559,508 B2 | 1/2017 | Shepard et al. | |
| 10,312,581 B2 | 6/2019 | Emerick et al. | |
| 11,128,068 B2 * | 9/2021 | Gruber | H01R 12/724 |
| 2003/0097839 A1 * | 5/2003 | Yazawa | H01L 23/40 60/527 |
| 2006/0019510 A1 * | 1/2006 | Rudduck | H05K 7/142 439/74 |
| 2006/0114662 A1 | 6/2006 | Liu et al. | |
| 2008/0032522 A1 * | 2/2008 | Gilliland | H05K 1/144 439/74 |
| 2015/0029687 A1 * | 1/2015 | Gillard | H05K 9/0007 361/753 |
| 2016/0238200 A1 * | 8/2016 | Schroeder | H05K 3/301 |
| 2019/0246488 A1 * | 8/2019 | Kuklinski | H05K 1/0203 |

* cited by examiner

STANDOFF FOR CIRCUIT BOARD HAVING TEMPERATURE-VARIABLE ELECTRICAL ELEMENT

CROSS REFERENCE TO RELATED APPLICATION

This application claims the benefit of Indian Provisional Patent Application No. 202011009058, filed Mar. 3, 2020, the entire disclosure of which is incorporated by reference in its entirety.

TECHNICAL FIELD

The present disclosure generally relates to a standoff support structure for supporting one or more components such as a printed circuit board (PCB) in an electronics assembly and relates, more particularly, to a standoff support structure having a temperature-variable electrical element for heating and/or cooling an area of an electronics assembly.

BACKGROUND

Many electronics assemblies include at least one printed circuit board (PCB) with electrical devices (e.g., integrated circuits, capacitors, resistors, inductors, discrete semiconductors) mounted thereon. The assembly may also include a chassis or housing that supports and encases the PCB(s). Furthermore, the assembly may include one or more standoffs that support the PCB(s) within the chassis, that maintain desired spacing between the PCB(s) and chassis, etc. These electronics assemblies can be provided in control systems, for example, in a telecommunications control system, a control system for a vehicle (e.g., an engine of an aircraft, spacecraft, or ground-based vehicle), and more.

The electrical devices within these electronics assemblies may be temperature sensitive. As such, operation of one or more devices within the assembly may be affected by the ambient temperature. There may be instances in which the devices are expected to function in extreme temperatures (extreme hot or extreme cold). The devices may also be exposed to extreme temperature changes, which may negatively affect functioning.

Electrical devices that are rated for use in extreme temperature conditions may be incorporated within the assembly; however, these devices are typically more expensive to incorporate. Also, temperature-controlled systems have been proposed that provide desired temperature conditions for temperature-sensitive electrical devices. However, these systems suffer from manufacturing inefficiencies, they take up substantial space within the assembly, add undesirable weight, and/or they are expensive.

Thus, it is desirable to provide an effective, efficient, compact, lightweight, temperature-control device that can be incorporated within an electronics assembly. It is also desirable to provide a temperature-control device that improves manufacturing efficiency and lowers cost. Other desirable features and characteristics of the present disclosure will become apparent from the subsequent detailed description and the appended claims, taken in conjunction with the accompanying drawings and this background discussion.

BRIEF SUMMARY

In one embodiment, a temperature-variable standoff for supporting a circuit board in an electronics assembly is disclosed. The circuit board supports an electrical device. The standoff includes a temperature-variable electrical element that selectively varies in temperature based on an electrical input thereto. The standoff also includes a support body that supports the temperature-variable electrical element and that is configured to support the circuit board separated at a distance from another component of the electronics assembly. The support body has a first end and a second end. The support body is configured to attach to the circuit board and to project away from the circuit board with the first end proximate the circuit board and the second end spaced away from the circuit board. The standoff further includes an electrical connector supported proximate the first end and electrically coupled to the temperature-variable electrical element. The electrical connector is configured to electrically connect within an electrical circuit of the circuit board to provide the electrical input to the temperature-variable electrical element for selectively varying the temperature thereof and for selectively adjusting a temperature condition proximate the electrical device.

In another embodiment, an electronics assembly is disclosed. The electronics assembly includes a printed circuit board that supports an electrical device and an electrical trace of a power supply circuit. The electronics assembly further includes a standoff with a support body, a temperature-variable electrical element, and an electrical connector. The temperature-variable electrical element selectively varies in temperature based on an electrical input thereto via the power supply circuit. The support body supports the temperature-variable electrical element. The support body retains the printed circuit board separated at a distance from another component of the electronics assembly. The support body has a first end and a second end. The support body is attached to the circuit board and projects away from the circuit board with the first end proximate the circuit board and the second end spaced away from the circuit board. Additionally, the electrical connector is supported proximate the first end and is electrically coupled to the temperature-variable electrical element. Also, the electrical connector is electrically connected to the electrical trace of the printed circuit board to provide the electrical input to the temperature-variable electrical element for selectively varying the temperature thereof and for selectively adjusting a temperature condition in an area of the electronics area proximate the electrical device.

In an additional embodiment, a method of operating an electronics assembly is disclosed. The electronics assembly includes a printed circuit board and a standoff that retains the printed circuit board separated at a distance from another component of the electronics assembly. The method includes detecting, with a sensor, a temperature proximate an electrical device supported on a printed circuit board of the electronics assembly. The printed circuit board supports an electrical trace of a power supply circuit. The method further includes receiving, by a processor of a control system, an input corresponding to the detected temperature. Furthermore, the method includes generating, by the processor, a command based on the received input for providing an electrical input via the electrical trace to a temperature-variable electrical element of the standoff for selectively varying the temperature of the standoff and for selectively adjusting a temperature condition in the area proximate the electrical device.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely exemplary in nature and is not intended to limit the present disclosure or the application and uses of the present disclosure. Furthermore, there is no intention to be bound by any theory presented in the preceding background or the following detailed description.

The present disclosure relates to a temperature-variable standoff (i.e., standoff structure, standoff assembly, etc.) for supporting a circuit board within an electronics assembly. The standoff may support the circuit board and the electrical devices mounted thereon separated at a distance from another component in the electronics assembly (e.g., separated at a distance from another circuit board, separated from a housing, casing, or other chassis member, etc.).

The standoff may include and/or incorporate various features of a temperature-control system. More specifically, the standoff may include one or more temperature-variable elements (e.g., a heating element, a thermoelectric device, etc.) that may be controlled to selectively change temperature of a nearby area of the electronics assembly. For example, the temperature-variable element may be a heating element that is selectively heated to heat the circuit board, the electrical device(s) mounted thereon, and/or the ambient air proximate the electrical device(s).

The temperature-variable standoff may be compactly and conveniently arranged within the electronics assembly. The temperature-variable components of the standoff may be electrically connected and incorporated within a power circuit of one or more circuit boards within the assembly. Stated differently, one or more electrical connectors of the standoff may electrically connect to a lead, via, trace, etc. supported by the circuit board(s) so as to incorporate the standoff within a power circuit. As such, the assembly may be more compact and manufacturing efficiency may be increased because of the standoffs of the present disclosure. Additionally, the standoffs may be conveniently and effectively positioned near temperature-sensitive electrical devices of the electronics assembly to maintain functionality thereof in a variety of environments. The standoff of the present disclosure also facilitates repair and/or retrofit of some electronics assemblies as will be discussed.

Figure 1:
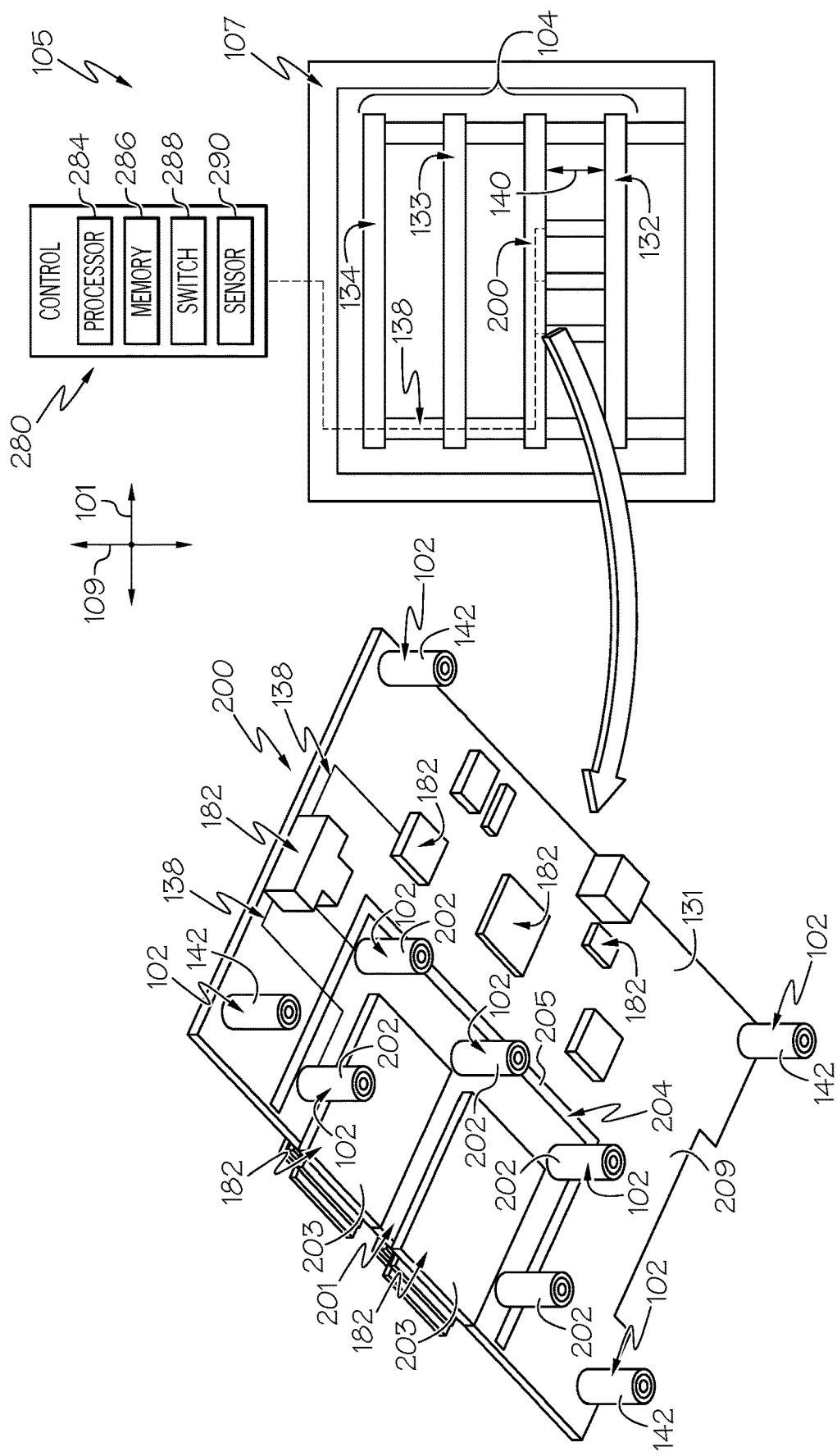
FIG. 1 is a schematic view of an electronics assembly according to example embodiments of the present disclosure.
Figure 2:
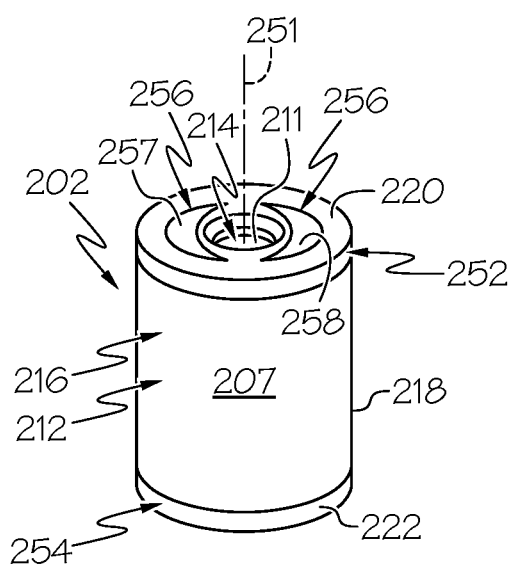
FIG. 2 is a perspective view of a temperature-variable standoff according to example embodiments of the present disclosure.

Referring initially to FIG. 1, an electronics assembly 105 is shown schematically. The electronics assembly 105 may be configured for control of any suitable system, such as a vehicle system, a telecommunications system, a radar system, or otherwise. In the case of a vehicle system, the electronics assembly 105 may be included in an aircraft system (e.g., an avionics system, a vehicle telecommunication system, a radar system, etc.). The electronics assembly 105 may include various features suited for use in extreme temperature conditions.

A Cartesian coordinate system is shown for reference purposes and includes a first axis 101 and an orthogonal second axis 109. The first axis 101 is oriented horizontally and the second axis 109 is oriented vertically in FIG. 1; however, it will be appreciated that this orientation is merely for reference and does not necessarily correlate to the direction of gravitational force.

The electronics assembly 105 may include one or more printed circuit boards 104 and a chassis 107 in some embodiments. As shown in the illustrated embodiment, there may be a plurality of printed circuit boards 104 including a first circuit board 200 (shown in detail) as well as a second circuit board 132, a third circuit board 133, and a fourth circuit board 134 encased within the chassis 107. The plurality of circuit boards 104 may lie along the first axis 101 and may be stacked and arranged along the second axis 109 with the first circuit board 200 disposed between the second and third circuit boards 132, 133.

The chassis 107 may be hollow and box-like. The chassis 107 may mechanically support the circuit boards 104. Also, in some embodiments, the chassis 107 may include insulative materials that limit heat transfer (either into or out of) the assembly 105 to help maintain a controlled temperature environment therein.

It will be appreciated that the assembly 105 may be configured to support any number of circuit boards 104. Also, it will be appreciated that the circuit boards 104 may be arranged within the electronics assembly 105 in other ways without departing from the scope of the present disclosure.

Figure 5:
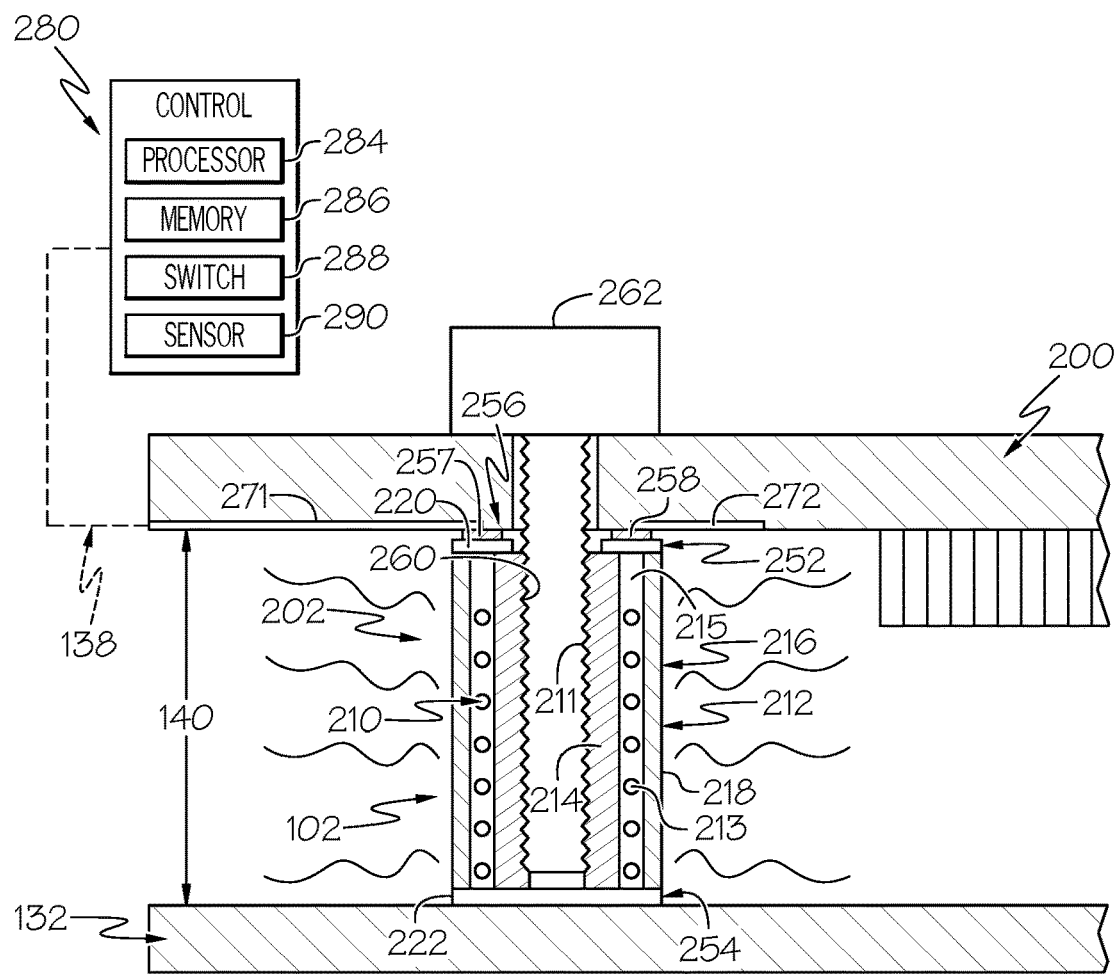
FIG. 5 is a side section view of the standoff of FIG. 2 installed within the electronics assembly of FIG. 1.

The first circuit board 200 (and/or the other circuit boards 104) may include a substantially flat and plate-like substrate 131. The substrate 131 may be made from an electrically insulative material. The circuit board 200 may also include one or more electrical devices 182, such as integrated circuits, resistors, capacitors, etc. that are supported on the substrate 131. Furthermore, the circuit board 200 may include electrical tracks, traces, pads, terminals, vias, or other wiring 138. The wiring 138 may include one or more elongate traces that are made out of electrically conductive material that is etched into the substrate 131. Segments of the wiring 138 may electrically connect respective ones of the electrical devices 182 within particular circuits of the electronics assembly 105. Also, as represented in FIG. 5, segments of the wiring 138 may extend through the electronics assembly 105 (e.g., between the circuit boards 104, for establishing electrical connection with a power source, an input device, an output device, hardware, an external memory device such as a subscriber identity module (SIM) card, etc.

Additionally, the electronics assembly 105 may include one or more standoffs 102. As shown, there may be a plurality of standoffs 102 arranged about the electronics assembly 105. As shown, the standoffs 102 may mechanically support the circuit boards 104 and structurally retain the circuit boards 104 separated at a distance from one another, from the chassis 107, and/or from other components of the electronics assembly 105. By way of example, the first printed circuit board 200 may be supported by a plurality of standoffs, including multiple (e.g., four) first standoffs 142 arranged at respective corners of the circuit board 200. The first standoffs 142 may be cylindrical and elongate and may support the first circuit board 200 at a distance 140 away from the second circuit board 132 along the second axis 109. The other circuit boards 132, 133, 134 may be supported by respective first standoffs 142 in some embodiments as well. It will be appreciated that the electronics assembly 105 may include any number of first standoffs 142, and the standoff(s) may be arranged in a variety of ways without departing from the scope of the present disclosure.

The standoffs 102 may also include one or more (e.g., five) temperature-variable standoffs 202. Like the first standoffs 142, the temperature-variable standoffs 202 may mechanically support the circuit boards 104 and structurally retain the circuit boards 104 separated at a distance from one another, from the chassis 107, and/or from other components of the electronics assembly 105. In addition, the standoffs 202 may include electrical components that selectively adjust the temperature of the standoff 202. These electrical components may be electrically connected to a power source via the wiring 138. In some embodiments, the standoffs 202 may electrically connect to segments of the wiring 138 (e.g., electrical traces) supported on the circuit board 200. Thus, the standoff 202 can support the circuit board 200 and conveniently connect the wiring 138 included thereon.

By way of example, the first printed circuit board 200 may be supported by five temperature-variable standoffs 202. The temperature-variable standoffs 202 may be arranged in a rectangular formation at a predetermined area 201, near an edge of the circuit board 200. One or more temperature-sensitive electrical devices 203 may be mounted and supported on the circuit board 200 within this area 201. In some embodiments, the temperature-sensitive electrical devices 203 are SIM cards and/or associated SIM card devices. The temperature-variable standoffs 202 may selectively heat and/or cool the area 201, thereby providing necessary temperature conditions for operations of the devices 203.

In some embodiments, the circuit board 200 may also include a heat transfer barrier member 204. The heat transfer barrier member 204 may be made from an insulative material (e.g., a glass-reinforced epoxy laminate material such as FR4) and may be etched or otherwise layered on the substrate 131 of the circuit board 200. The barrier member 204 may also be disposed in grooves of the substrate 131. In some embodiments, the heat transfer barrier member 204 may be arranged as an elongate, band-like thermal barrier 205 that extends continuously from one edge and back so as to subdivide and separate the area 201 from an adjacent area 209 of the circuit board 200. Also, the thermal barrier 205 may extend across the substrate 131 and may at least partly surround one or more temperature-variable standoffs 202. As shown in FIG. 1, the thermal barrier 205 may, in cooperation with the edge of the circuit board 200, surround the temperature-variable standoffs 202 and the temperature-sensitive electrical devices 203 within the area 201 of the circuit board 200. Accordingly, the temperature-variable standoffs 202 may selectively adjust temperature conditions within the area 201 (either heat or cool the area 201), and the thermal barrier 205 may insulate the area 201 to maintain the area at the adjusted temperature conditions.

Referring now to FIGS. 2-5, an example embodiment of the temperature-variable standoffs 202 will be discussed in greater detail. In general, the standoff 202 may be elongate, extending along a longitudinal axis 251 between a first end 252 and a second end 254. The axis 251 may be oriented parallel to the second axis 109 (FIG. 1) in some embodiments. The standoff 202 may be cylindrical, centered about the axis 251, with a width that remains constant between the first and second ends 252, 254. In some embodiments, the standoff 202 may have a rounded (e.g., circular) cross section taken normal to the axis 251.

The standoff 202 may generally include a support body 212. The support body 212 may include one or more rigid and strong structures that resist vibration, gravitational, inertial, and/or other forces to retain the circuit board 200 and maintain the circuit board 200 separated from the second circuit board 132 (FIG. 1). The support body 212 may, therefore, be elongate along the longitudinal axis 251 and may define the cylindrical profile of the standoff 202 between the first end 252 and the second end 254. The support body 212 may also define an exterior surface 207 of the standoff 202 and may be at least partly hollow so as to define an interior surface 211 of the standoff 202.

Figure 3:
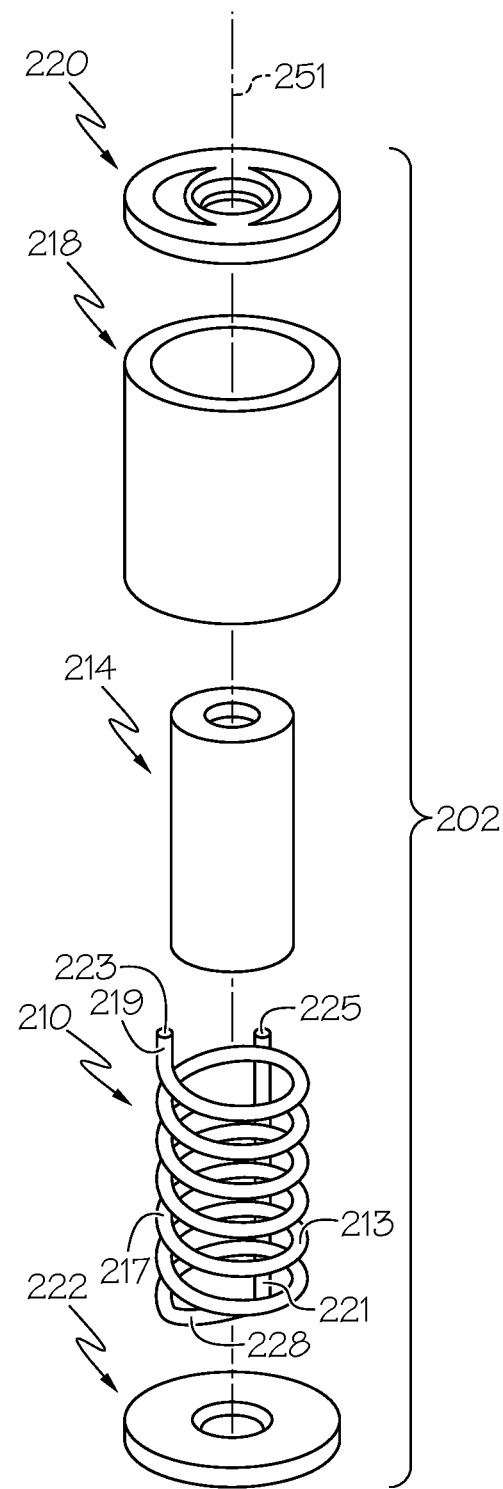
FIG. 3 is an exploded perspective view of the standoff of FIG. 2.

In some embodiments, the support body 212 may include an internal support 214. As shown in FIG. 3, the internal support 214 may be hollow and cylindrical with a rounded (e.g., circular) cross section. The internal support 214 may be made out of a rigid material. The internal support 214 may also define the majority of the interior surface 211 of the standoff 202.

The support body 212 may further include a covering 216 that defines a majority of the exterior surface 207 of the standoff 202. The covering 216 may include a radial standoff cover 218, a first end cap 220, and a second end cap 222, each of which may be made from a rigid material. The radial standoff cover 218 may be cylindrical and hollow with a rounded (e.g., circular) cross section. The first and second end caps 220, 222 may be annular and disc-shaped. The first end cap 220 may be fixedly attached to the radial standoff cover 218 and may cover over the open end of the radial standoff cover 218 at the first end 252 of the standoff 202. The second end cap 222 may be fixedly attached to the radial standoff cover 218 and may cover over the other open end of the radial standoff cover 218 at the second end 254. The end caps 220, 222 may be fixedly attached to the radial standoff cover 218 via welded attachments, adhesives, fasteners, or other attachments. Furthermore, the internal support 214 may be received within the covering 216. More specifically, the internal support 214 may extend between, abut, and/or attach to the first and second end caps 220, 222. Both the internal support 214 and the covering 216 may be coaxial about the axis 251 so as define a radial space 215 (FIG. 5) between the internal support 214 and the radial standoff cover 218.

The support body 212 may be made from one or more materials that provide desired heat transfer characteristics. One or more areas may be thermally conductive (e.g., made from a metallic material) to promote heat transfer. One or more other areas may be thermally resistive (e.g., made from a ceramic material) to inhibit such heat transfer.

The standoff 202 may further include at least one temperature-variable electrical element 210. The temperature-variable electrical element 210 may be configured to selectively vary in temperature (either heat up or cool down) based on an electrical input thereto. As illustrated and as will be discussed in detail as an example, the temperature-variable electrical element 210 may be an electric heating element that selectively heats the standoff 202. However, it will be appreciated that the element 210 may be of any suitable type. Specifically, it will be appreciated that the element 210 may be an electric cooling element (e.g., a thermoelectric device that relies upon the thermoelectric effect to cool the standoff 202) without departing from the scope of the present disclosure.

In some embodiments, the element 210 may include a filament 213. The filament 213 may be made of an electrically resistive material in embodiments in which the element 210 is a resistive heating element. The filament 213 may extend between the first end 252 and second end 254 of the standoff 202. Stated differently, the filament 213 may extend from the first end 252 to the second end 254 at least once. Additionally, as shown, the filament 213 may extend from the first end 252 to the second end 254 and back at least once. As shown, the filament 213 may include a helical portion 217 that extends helically about the axis 251. The filament 213 may also include a first longitudinal segment 219 and a second longitudinal segment 221 that extend along the axis 251. In some embodiments, the first and/or second longitudinal segments 219, 221 may be substantially straight and linear, and in some embodiments parallel to the axis 251. The first longitudinal segment 219 may extend longitudinally from one end (a top end) of the helical portion 217 and may terminate at a first terminal 223 of the element 213. The filament 213 may include a radial segment 228 that extends radially from the other end (a bottom end) of the helical portion 217 radially from one side of the axis 251 to the other. The radial segment 228 may intersect the axis 251 in some embodiments. The second longitudinal segment 221 may extend longitudinally from the radial segment 228 and may terminate at a second terminal 225. In some embodiments, the longitudinal segments 219, 221 may extend in the same direction (i.e., from the second end 254 toward the first end 252) from the helical portion 217. Thus, as shown in the illustrated embodiment, the filament 213 may extend from the first terminal 223, along the first longitudinal segment 219, along the helical portion 217, turn in the radial direction and extend along the radial segment 228, and turn longitudinally back toward the first end 252, extending along the second longitudinal segment 221, and terminating at the second terminal 225.

As stated, the temperature-variable electrical element 210 may be configured differently without departing from the scope of the present disclosure. For example, the electrical element 210 may be a thermoelectric device that cools the standoff 202. In these embodiments, the element 210 may be thermally connected to a heat sink for cooling purposes.

The filament 213 may be received and supported by the support body 212. For example, as shown in FIG. 5, the filament 213 may be disposed within the space 215 between the internal support 214 and the covering 216. In some embodiments, the helical portion 217 may be wound about and may receive the internal support 214. The radial segment 228 may extend along the bottom end of the internal support 214. Also, the radial standoff cover 218 may receive the filament 213 and the internal support 214 so as to cover over the outer radial portions of the filament 213. The first end cap 220 may be fixedly attached to the radial standoff cover 218 to cover over one open end of the temperature-variable element 210 and the internal support 214. The second end cap 222 may be fixedly attached to the radial standoff cover 218 to cover over the other open end, the radial segment 228, and the internal support 214. As such, the radial standoff cover 218 and the first and second caps 220, 222 may cooperatively define the exterior surface 207 of the standoff 202, and also cooperatively cover and protect the temperature-variable electrical element 210. These components support the electrical element 210 while also robustly securing the circuit board 200 within the assembly 105. Additionally, the cover 218, the first cap 220, and/or the second cap 222 may provide desirable heat transfer characteristics.

In additional embodiments, the temperature-variable electrical element 210 may be embedded in one or more components of support body 212. For example, the support body 212 may be molded about the element 210, thereby covering over, and defining the exterior surface 207 of the standoff 202. The temperature-variable electrical element 210 may be supported and attached to the support body 212 in other ways as well without departing from the scope of the present disclosure.

Figure 4:
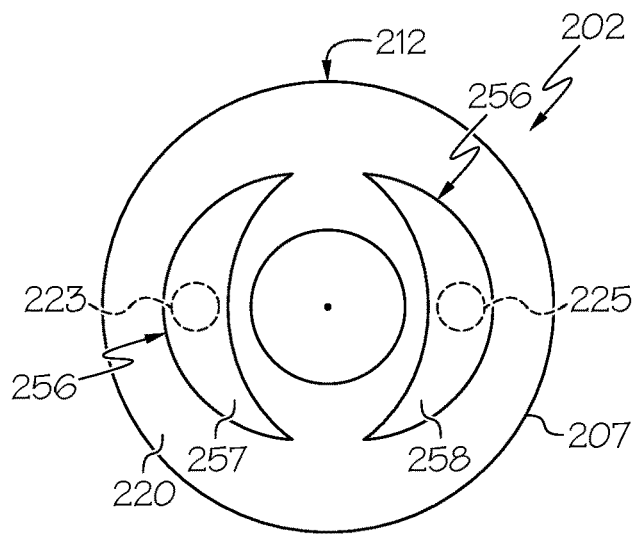
FIG. 4 is a top view of the standoff of FIG. 2.

Furthermore, as shown in FIGS. 4 and 5, the standoff 202 may include a plurality of electrical connectors 256. There may be a first connector 257 and a second connector 258. The connectors 257, 258 may be made of a conductive material, such as a beryllium/copper alloy. The connectors 257, 258 may have a distinct shape, such as flat, crescent shape. The connectors 257, 258 may be disposed proximate the first end 252 of the standoff 202 in some embodiments. In other embodiments, one connector 257, 258 may be disposed proximate the first end 252 and the other connector 257, 258 may be disposed proximate the second end 254. As illustrated, the connectors 257, 258 may be supported on (e.g., layered on) the first end cap 220. The connectors 257, 258 may be thin, lying substantially flat and flush against the surrounding areas of the first end cap 220. In other embodiments, the first connector 257 and/or the second connector 258 may be disposed on the second end cap 222. In further embodiments, the first connector 257 and/or the second connector 258 may be disposed on the radial standoff cover 218. For example, one or both may be disposed on the cover 218, proximate the first end 252 of the standoff 202. Other variations fall within the scope of the present disclosure as well. The position of the connectors 257, 258 may facilitate electrical connection of the standoff 202 to external circuitry (e.g., a power supply circuit).

The connectors 257, 258 may be electrically connected to the temperature-variable electrical element 210. The first connector 257 may be electrically connected to the first terminal 223, and the second connector 258 may be electrically connected to the second terminal 225. In some embodiments, the terminals 223, 225 may extend through respective holes formed in the first end cap 220 to electrically connect to the underside surface of the electrical connectors 257, 258. In other embodiments, instead of holes, the connectors 257, 258 may extend through the thickness of the first end cap 220 to electrically connect to the terminals 223, 225. Thus, the connectors 257, 258 may define exterior electrical terminals for the standoff 202.

Moreover, as shown in FIG. 5, the standoff 202 may be mechanically attached to the first circuit board 200 and support it at a distance 140 from the second circuit board 132. In some embodiments, the support body 212 may include surface features such as threading 260, an undercut surface, etc. for engaging a fastener 262. As shown, the internal support 214 may include threading 260 on its inner diameter surface. The fastener 262 may be a bolt as shown in FIG. 5, which extends through the first circuit board 200 and is received within the standoff 202 to threadably attach to the threading 260. The support body 212 thus attaches to the circuit board 200 and projects away from the circuit board 200 with the first end 252 proximate the circuit board 200 and the second end 254 spaced away from the circuit board 200. The standoff 202 may remain detached from the second circuit board 132; however, the second end 254 may abut against the second circuit board 132 such that the standoff 202 resists compressive forces and maintains the first and second circuit boards 200, 132 separated at a distance 140.

Furthermore, the electrical connectors 257, 258 may electrically connect to the wiring 138 of the first circuit board 200 (FIG. 5). For example, the first circuit board 200 may include a first electrical trace 271 and a second electrical trace 272. The traces 271, 272 may be electrically conductive lines that are etched in the surface opposing the electrical connectors 257, 258. Mechanical installation of the standoff 202 can conveniently electrically connect the connectors 257, 258 to the traces 271, 272, respectively.

The traces 271, 272 may also be wired within one or more electrical circuits with a control system 280. The control system 280 may have various configurations that each fall within the scope of the present disclosure. Generally, the control system 280 may control power delivery to the temperature-variable electrical element 210 of the standoff 202. The control system 280 may have many different configurations that each fall within the scope of the present disclosure. The following discussion will provide examples of the control system 280, including examples that are relatively simple in design, that are compact, and that are effective and energy efficient.

The control system 280 may include at least one processor 284 that includes and/or is electrically connected to a computer memory device 286. The processor 284 and memory device 286 may include one or more modules for processing information and for outputting commands (e.g., control commands for controlling the temperature of the standoff 202). As used herein, the term "module" refers to any hardware, software, firmware, electronic control component, processing logic, and/or processor device, individually or in any combination, including without limitation: application specific integrated circuit (ASIC), an electronic circuit, a processor (shared, dedicated, or group) and memory that executes one or more software or firmware programs, a combinational logic circuit, and/or other suitable components that provide the described functionality.

With regard to the control system 280, embodiments may be described herein in terms of functional and/or logical block components and various processing steps. It should be appreciated that such block components may be realized by any number of hardware, software, and/or firmware components configured to perform the specified functions. For example, an embodiment of the present disclosure may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments of the present disclosure may be practiced in conjunction with any number of systems included in the electronics assembly 105. Indeed, the control system 280 may control the temperature of the standoff 202 as well as control other systems of the electronics assembly 105.

For the sake of brevity, conventional techniques related to signal processing, data transmission, signaling, control, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment of the present disclosure In addition to the processor 284 and memory device 286, the control system 280 may include a switch 288 and one or more sensors 290. The switch 288 may have an ON position in which power flows to the temperature-variable electrical element 210 and an OFF position, which cuts off power flow to the element 210. The sensor(s) 290 may comprise one or more thermometers that detect a "temperature condition" proximate the electrical devices 203 within the area 201 of the electronics assembly 105. The term "temperature condition" is intended broadly to mean one or more temperatures in and/or around the area 201, an ambient temperature outside the electronics assembly 105, a map of temperatures across the board 200, or other temperature detected by the sensor(s) 290.

Figure 6:
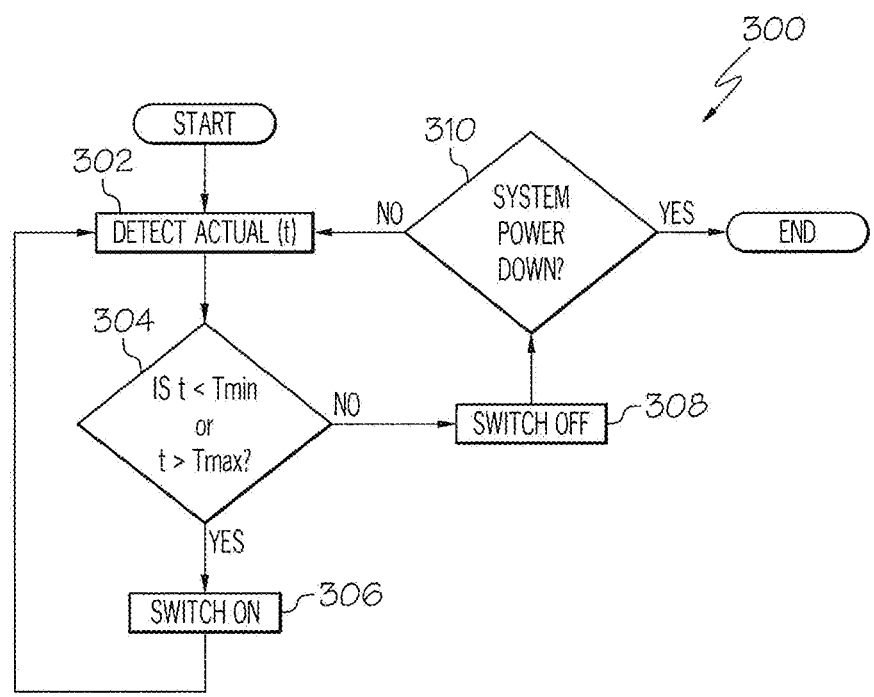
FIG. 6 is a flowchart illustrating a method of operating the standoff according to example embodiments.
Figure 7:
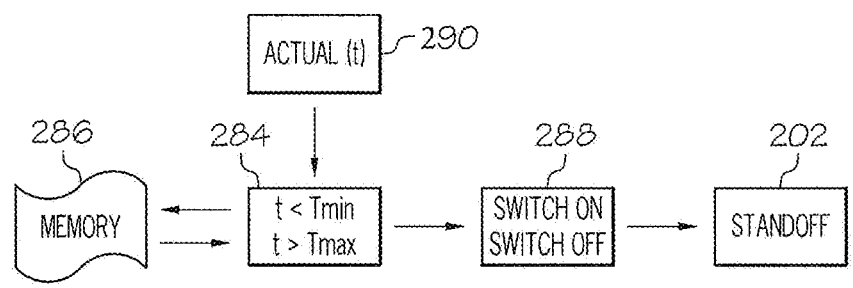
FIG. 7 is a dataflow diagram illustrating the method of operating the standoff according to example embodiments.

FIGS. 6 and 7 illustrate a method 300 of operating the electronics assembly 105 and the standoff 202 according to example embodiments. At 302 of the method 300, the sensor 290 may detect the temperature condition ("Actual t") and provide data input corresponding to the detected temperature condition to the processor 284. The processor 284 may, in turn, generate a control command that changes the switch 288 between its ON and OFF positions based on this temperature data input. In some embodiments, at 304 of the method 300, the processor 284 accesses the memory device 286 and compares the detected temperature(s) to one or more predetermined thresholds (e.g., a minimum temperature threshold "Tmin" and/or a maximum temperature threshold "Tmax") stored on the memory device 286. If the processor 284 determines that the detected temperature is below the minimum temperature threshold or that the detected temperature is above the maximum temperature threshold (304 answered positively), then at 306 the processor 284 may command the switch 288 to be turned ON, providing the electrical input to the temperature-variable electrical element 210 and changing its temperature. The method 300 may loop back to 302 and so on. Once the detected temperature is within the predetermined range (between Tmin and Tmax), then at 308 the processor 284 may command the switch 288 to turn OFF. The method 300 may continue to 310 where it is determined whether the system is to be powered off. If answered negatively, the method 300 may loop back to 302 and so on. If the system is to be powered off, then the method 300 may terminate.

In embodiments in which the temperature-variable electrical element 210 is a resistive heating element that provides heat, the sensor 290 may detect the actual temperature (at 302), and (at 304) the processor 284 may determine that the temperature is below the minimum temperature, Tmin. Thus, at 306, the switch 288 may be turned ON, supplying power to heat the filament 213. This heat is transferred from the support body 212 to the circuit board 200, to the electrical devices 182, and/or to the ambient air proximate the electrical devices 182. The barrier member 204 may insulate and retain this heat in the area 201. Once the actual temperature, t, is above the minimum temperature, Tmin, then the switch 288 may be turned OFF. This process may be repeated as needed until the system is powered down (310 answered affirmatively).

Accordingly, the standoffs 202 may selectively heat the area 201 and the electrical devices 182 therein. The standoffs 202 may adjust the temperature quickly and efficiently. In some embodiments, the standoffs 202 can adjust the area 201 from −55° C. to −20° C. within eight minutes. It will be appreciated that the system may be tailored in other ways as well to deliver desired heating and/or cooling performance while also providing robust mechanical support within the electronics assembly 105.

Figure 8:
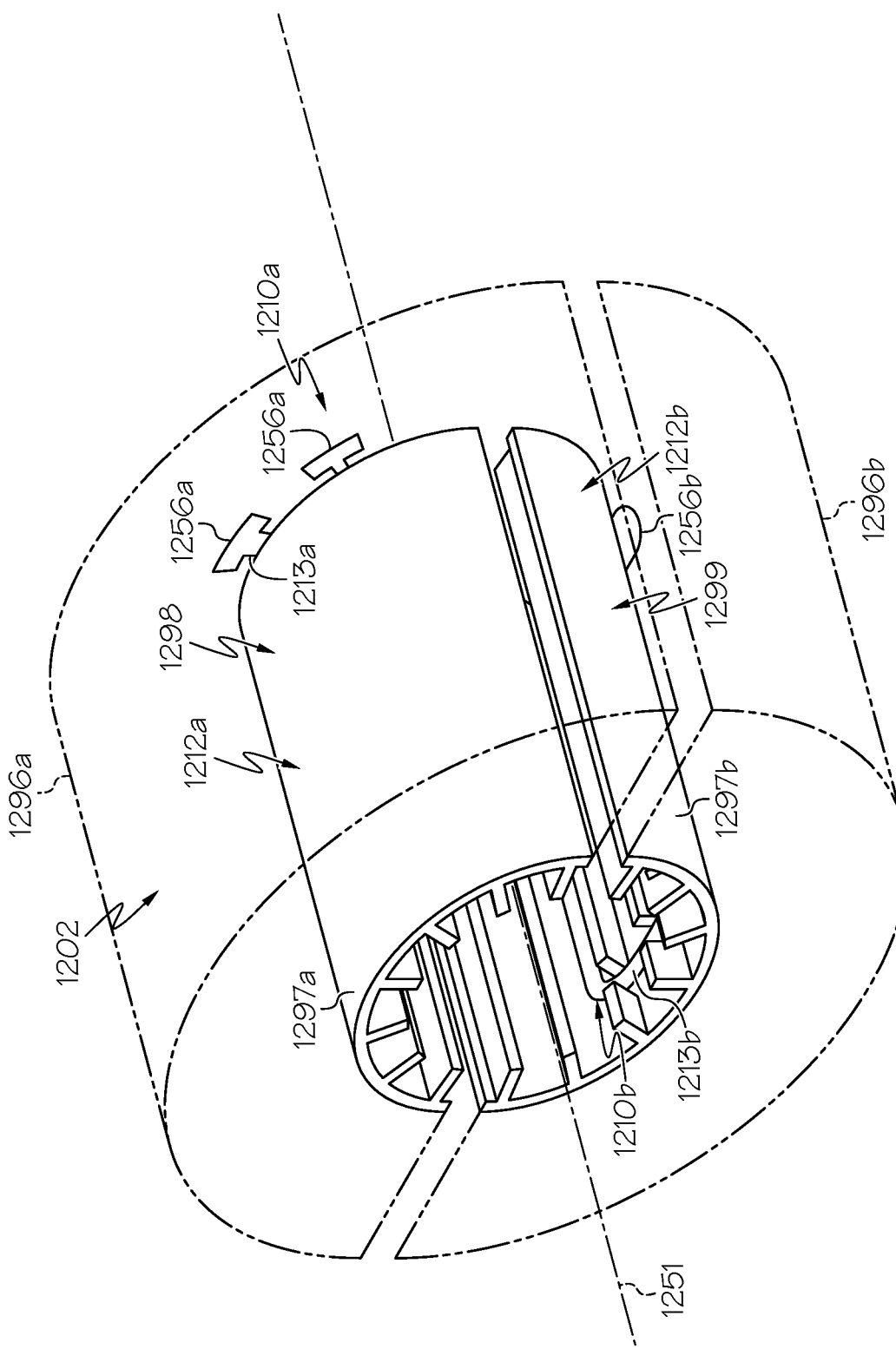
FIG. 8 is a perspective view of the temperature-variable standoff according to additional embodiments of the present disclosure.
Figure 9:
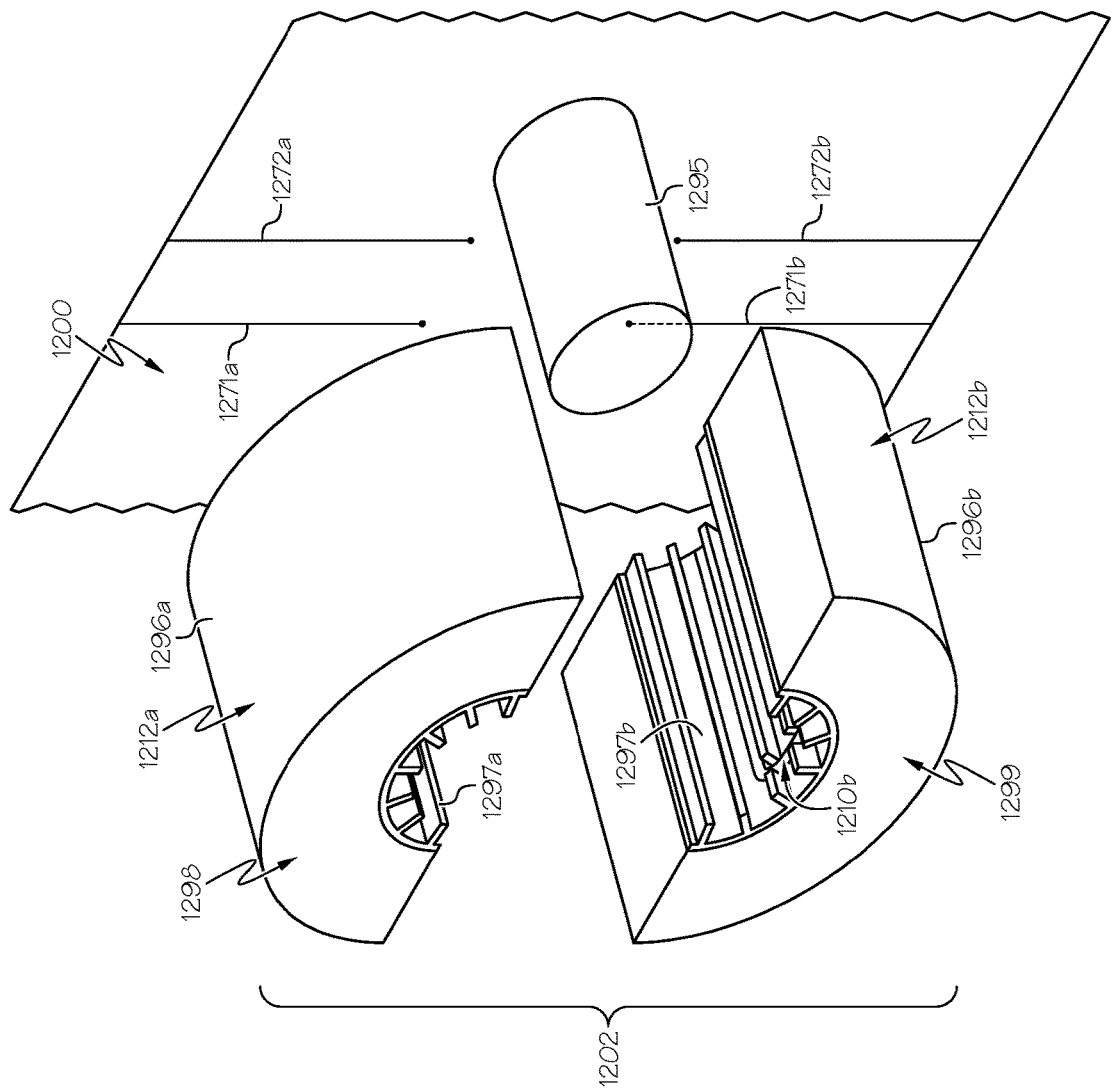
FIG. 9 is an exploded perspective view of the standoff of FIG. 6 and other components of an electronics assembly.

FIGS. 8 and 9 illustrate additional embodiments of the standoff 1202. The standoff 1202 may include one or more features of the standoff 202 discussed above. Components that correspond to those of FIGS. 1-7 are indicated in FIGS. 8 and 9 with corresponding reference numbers increased by 1000. As will be discussed, the standoff 1202 may include separate portions or pieces that are removably attached. In some embodiments, a plurality of the portions/pieces may be equipped with a respective temperature-variable electrical element. Also, the portions/pieces may be attached over existing standoff structures, for example, to retrofit existing circuit board configurations.

As shown, the standoff 1202 may include a first portion 1298 and a second portion 1299 that are removably attached. In some embodiments, the portions 1298, 1299 may be arcuate (arch-like) and curved about the axis 1251. The portions 1298, 1299 may be joined together along opposing edges by a fastener, adhesives, etc. and together, the portions 1298, 1299 may define the hollow, cylindrical shape of the standoffs 202 discussed above with respect to FIG. 2.

Both portions 1298, 1299 may include a support body 1212*a*, 1212*b* with a ribbed core 1297*a*, 1297*b* and an arcuate outer jacket 1296*a*, 1296*b*. In some embodiments, both portions 1298, 1299 may include a respective temperature-variable electrical element 1210*a*, 1210*b*. The filament 1213*a*, 1213*b* may extend axially from one end of the core 1297*a*, 1297*b*, to the other and back. The filaments 1213*a*, 1213*b* may extend between the ribs of the cores 1297*a*, 1297*b*. The portions 1298, 1299 may also include respective electrical connectors 1256*a*, 1256*b* that are flat and supported on the jackets 1296*a*, 1296*b* for electrically connecting the respective filament 1213*a*, 1213*b* to the traces 1271*a*, 1271*b*, 1272*a*, 1272*b* of the circuit board 1200.

In some embodiments, the portions 1298, 1299 may be attached together to wrap around an existing standoff structure 1295 of the circuit board. Also, the traces 1271*a*, 1271*b*, 1272*a*, 1272*b* may be part of a jumper circuit that are retroactively added to the circuit board 1200. Thus, the standoff 1202 of FIGS. 8 and 9 may be useful for retrofitting the existing standoff structure 1295 of the circuit board 1200, making it temperature-variable.

Accordingly, the standoffs 202, 1202 of the present disclosure may provide robust support for the circuit board 200, 1200. Furthermore, the standoffs 202, 1202 may effectively and efficiently provide heating and/or cooling. This ensures that the electrical devices 182 will function as intended. Also, in some embodiments, less expensive electrical devices 182 (those that are rated for non-extreme temperatures) may be employed in the electronics assembly 105 because of the standoffs 202, 1202 of the present disclosure. The standoffs 202, 1202 are also convenient to install and to electrically connect. Also, the standoffs 202, 1202 may be relatively compact for added benefit.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the present disclosure in any way. Rather, the foregoing detailed description will provide those skilled in the art with a convenient road map for implementing an exemplary embodiment of the present disclosure. It is understood that various changes may be made in the function and arrangement of elements described in an exemplary embodiment without departing from the scope of the present disclosure as set forth in the appended claims.

What is claimed is:

1. A temperature-variable standoff for supporting a circuit board in an electronics assembly, the circuit board supporting an electrical device, the standoff comprising:
a temperature-variable electrical element that selectively varies in temperature based on an electrical input thereto;
a support body that supports the temperature-variable electrical element and that is configured to support the circuit board separated at a distance from another component of the electronics assembly, the support body having a first end and a second end, the support body configured to attach to the circuit board and to project away from the circuit board with the first end proximate the circuit board and the second end spaced away from the circuit board; and
an electrical connector supported proximate the first end and electrically coupled to the temperature-variable electrical element, the electrical connector configured to electrically connect within an electrical circuit of the circuit board to provide the electrical input to the temperature-variable electrical element for selectively varying the temperature thereof and for selectively adjusting a temperature condition proximate the electrical device.

2. The standoff of claim 1, wherein the temperature-variable electrical element is a resistive heating element.

3. The standoff of claim 2, wherein the support body is elongate with a longitudinal axis that extends between the first end and the second end; and
wherein at least part of the resistive heating element helically extends about the longitudinal axis.

4. The standoff of claim 2, wherein the support body is elongate with a longitudinal axis that extends between the first end and the second end; and
wherein the resistive heating element includes a filament that continuously extends between the first end and the second end and back at least once.

5. The standoff of claim 4, wherein the filament includes a substantially straight linear segment that extends between the first end and the second end.

6. The standoff of claim 1, wherein the electrical connector is a first electrical connector and further comprising a second electrical connector, the first and second electrical connector both supported proximate the first end and configured to electrically connect the temperature-variable electrical element within the electrical circuit.

7. The standoff of claim 6, wherein the support body includes a radial cover and a cap that cooperatively define an exterior of the standoff;
wherein the cap covers an open end of the radial cover proximate the first end; and
wherein the cap supports the first and second electrical connectors.

8. The standoff of claim 1, wherein the support body includes an internal support and an external covering, a space defined between the internal support and the external covering; and
wherein the temperature-variable electrical element is disposed in the space between the internal support and the external covering.

9. The standoff of claim 8, wherein the external covering includes a radial cover, a first cap at the first end, and a second cap at the second end; and
wherein the first cap supports the electrical connector.

10. The standoff of claim 1, wherein the support body includes a first portion and a second portion that attach together about a longitudinal axis; and wherein the first portion includes the temperature-variable electrical element as a first temperature-variable electrical element; and wherein the second portion includes a second temperature-variable electrical element that selectively varies in temperature.

11. An electronics assembly comprising:

a printed circuit board that supports an electrical device and an electrical trace of a power supply circuit;

a standoff that includes a support body, a temperature-variable electrical element, and an electrical connector;

the temperature-variable electrical element selectively varying in temperature based on an electrical input thereto via the power supply circuit;

the support body supporting the temperature-variable electrical element, the support body retaining the printed circuit board separated at a distance from another component of the electronics assembly, the support body having a first end and a second end, the support body attached to the circuit board projecting away from the circuit board with the first end proximate the circuit board and the second end spaced away from the circuit board; and the electrical connector supported proximate the first end and electrically coupled to the temperature-variable electrical element, the electrical connector electrically connected to the electrical trace of the printed circuit board to provide the electrical input to the temperature-variable electrical element for selectively varying the temperature thereof and for selectively adjusting a temperature condition in an area of the electronics area proximate the electrical device.

12. The electronics assembly of claim 11, further comprising a control system with a processor and a temperature sensor that detects the temperature condition proximate the electrical device; and the processor configured to receive an input corresponding to the detected temperature condition and, based on the received input, generate a command for providing the electrical input to the temperature-variable electrical element, thereby selectively varying temperature of the temperature-variable electrical element.

13. The electronics assembly of claim 11, wherein the printed circuit board supports a thermal barrier that separates the area proximate the electrical device from an adjacent area, the thermal barrier being insulative to limit heat transfer between the area proximate the electrical device and the adjacent area.

14. The electronics assembly of claim 13, wherein the standoff is one of a plurality of standoffs, each including a respective temperature-variable electrical element, a respective support body, and a respective electrical connector;

wherein the thermal barrier extends across the printed circuit board and at least partly surrounds the plurality of standoffs within the area proximate the electrical device.

15. The electronics assembly of claim 11, wherein the temperature-variable electrical element is a resistive heating element that selectively heats based on the electrical input thereto via the power supply circuit.

16. The electronics assembly of claim 11, wherein the electrical connector is a first electrical connector and further comprising a second electrical connector, the first and second electrical connector both supported proximate the first end, the first electrical connector connected to the electrical trace of the power supply circuit, the second electrical connector connected to another electrical trace of the power supply circuit.

17. The electronics assembly of claim 11, wherein the support body includes an internal support and an external covering, a space defined between the internal support and the external covering; and wherein the temperature-variable electrical element is disposed in the space between the internal support and the external covering.

18. The electronics assembly of claim 11, wherein the support body includes a first portion and a second portion that attach together about a longitudinal axis; and wherein the first portion includes the temperature-variable electrical element as a first temperature-variable electrical element; and wherein the second portion includes a second temperature-variable electrical element that selectively varies in temperature.

19. A method of operating an electronics assembly that includes a printed circuit board and a standoff that retains the printed circuit board separated at a distance from another component of the electronics assembly, the method comprising:

detecting, with a sensor, a temperature proximate an electrical device supported on the printed circuit board of the electronics assembly, the printed circuit board supporting an electrical trace of a power supply circuit;

receiving, by a processor of a control system, an input corresponding to the detected temperature; and generating, by the processor, a command based on the received input for providing an electrical input via the electrical trace to a temperature-variable electrical element of the standoff for selectively varying the temperature of the standoff and for selectively adjusting a temperature condition in the area proximate the electrical device.

20. The method of claim 19, further comprising a switch that has an ON position and an OFF position, electrical power being supplied to the temperature-variable electrical element when in the ON position, and electrical power being cut off from the temperature-variable electrical element when in the OFF position;

further comprising comparing, by the processor, the detected temperature to a predetermined threshold temperature; and further comprising generating the command to switch the switch between the ON position and the OFF position based on the comparison of the detected temperature and the predetermined threshold temperature.

* * * * *